(12) United States Patent
Hiramatsu et al.

(10) Patent No.: US 9,746,145 B2
(45) Date of Patent: Aug. 29, 2017

(54) LIGHT-EMITTING DEVICE WITH NON-SUCCESSIVE PLACEMENT OF LIGHT-EMITTING ELEMENTS OF ONE COLOR, ILLUMINATION LIGHT SOURCE HAVING THE SAME, AND ILLUMINATION DEVICE HAVING THE SAME

(71) Applicant: PANASONIC INTELLECTUAL PROPERTY MANAGEMENT CO., LTD., Osaka (JP)

(72) Inventors: Kohji Hiramatsu, Osaka (JP); Tomoya Iwahashi, Osaka (JP); Koji Omura, Osaka (JP); Ran Zheng, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 149 days.

(21) Appl. No.: 14/641,736

(22) Filed: Mar. 9, 2015

(65) Prior Publication Data
US 2015/0260351 A1   Sep. 17, 2015

(30) Foreign Application Priority Data
Mar. 14, 2014   (JP) .................................. 2014-051139

(51) Int. Cl.
*H01L 27/15* (2006.01)
*F21S 8/02* (2006.01)
(Continued)

(52) U.S. Cl.
CPC ............. *F21S 8/026* (2013.01); *F21K 9/232* (2016.08); *H01L 27/156* (2013.01); *F21K 9/27* (2016.08);
(Continued)

(58) Field of Classification Search
CPC ............. F21Y 2105/12; F21Y 2105/00; F21Y 2105/14–2105/18; H01L 25/0753;
(Continued)

(56) References Cited

U.S. PATENT DOCUMENTS

| 8,337,071 B2* | 12/2012 | Negley ..................... F21S 8/02 |
| | | 362/648 |
| 2002/0048177 A1* | 4/2002 | Rahm ................. H01L 25/0753 |
| | | 362/555 |

(Continued)

FOREIGN PATENT DOCUMENTS

| JP | 2011-146640 | 7/2011 |
| JP | 2011-192703 | 9/2011 |

(Continued)

OTHER PUBLICATIONS

Machine translation of Kondo, Application No. JP 2013-178631, publication No. JP 2015-050205, retrieved Feb. 8, 2017.*

(Continued)

*Primary Examiner* — Anh Mai
*Assistant Examiner* — Steven Horikoshi
(74) *Attorney, Agent, or Firm* — Greenblum & Bernstein, P.L.C.

(57) ABSTRACT

A light-emitting device includes a board; and light-emitting element arrays connected in parallel and each including light-emitting elements mounted on the board and connected in series. The light-emitting elements in each of the light-emitting element arrays include one or more red LED chips and one or more blue LED chips. Each of the red LED chips on the board is disposed non-successively to any other one of the red LED chips along a Y direction and along an X direction. The Y direction is parallel to a direction along which the red LED chips included in one of the light (Continued)

emitting arrays including the red LED chip are arranged. The X direction is perpendicular to the Y direction.

12 Claims, 13 Drawing Sheets

(51) Int. Cl.
| | |
|---|---|
| F21K 9/232 | (2016.01) |
| F21V 3/02 | (2006.01) |
| F21V 3/04 | (2006.01) |
| H01L 33/50 | (2010.01) |
| H01L 33/62 | (2010.01) |
| F21Y 105/12 | (2016.01) |
| F21Y 105/10 | (2016.01) |
| F21K 9/27 | (2016.01) |
| F21Y 115/10 | (2016.01) |
| F21Y 113/13 | (2016.01) |

(52) U.S. Cl.
CPC ............... *F21V 3/02* (2013.01); *F21V 3/0418* (2013.01); *F21V 3/0436* (2013.01); *F21Y 2105/10* (2016.08); *F21Y 2105/12* (2016.08); *F21Y 2113/13* (2016.08); *F21Y 2115/10* (2016.08); *H01L 33/505* (2013.01); *H01L 33/62* (2013.01); *H01L 2224/48091* (2013.01); *H01L 2224/48137* (2013.01)

(58) Field of Classification Search
CPC ...... H01L 27/156; H01L 33/50–33/508; F21K 9/23–9/233; F21K 9/27; F21K 9/60; F21K 9/64; F21K 9/69
See application file for complete search history.

(56) References Cited

U.S. PATENT DOCUMENTS

| | | | | |
|---|---|---|---|---|
| 2002/0070681 | A1* | 6/2002 | Shimizu | H01L 25/0753 315/246 |
| 2005/0122705 | A1* | 6/2005 | Pohlert | F21K 9/65 362/11 |
| 2007/0278510 | A1* | 12/2007 | Sakuma | C04B 35/597 257/98 |
| 2011/0199787 | A1* | 8/2011 | Kim | G02B 6/0023 362/612 |
| 2011/0222264 | A1 | 9/2011 | Matsuda et al. | |
| 2013/0015461 | A1* | 1/2013 | Lin | H01L 25/0753 257/76 |
| 2013/0088142 | A1* | 4/2013 | Allen | F21K 9/62 313/498 |
| 2013/0114242 | A1* | 5/2013 | Pickard | F21V 9/16 362/84 |
| 2015/0060900 | A1* | 3/2015 | Kondo | H01L 25/0753 257/89 |

FOREIGN PATENT DOCUMENTS

| | | | | |
|---|---|---|---|---|
| JP | 2011-216868 | | 10/2011 | |
| JP | 2012-142429 | | 7/2012 | |
| JP | 2015050205 A | * | 3/2015 | ......... H01L 25/0753 |

OTHER PUBLICATIONS

U.S. Appl. No. 14/643,412, to Kohji Hiramatsu et al., filed Mar. 10, 2015.

* cited by examiner

LIGHT-EMITTING DEVICE WITH NON-SUCCESSIVE PLACEMENT OF LIGHT-EMITTING ELEMENTS OF ONE COLOR, ILLUMINATION LIGHT SOURCE HAVING THE SAME, AND ILLUMINATION DEVICE HAVING THE SAME

BACKGROUND

1. Field of the Invention

The present disclosure relates to a light-emitting device and the like. In the light-emitting device, light-emitting elements are mounted on a board.

2. Description of the Related Art

Semiconductor light-emitting elements, such as light-emitting diodes (LEDs), are high-efficient, space-saving light sources widely used in a variety of illumination devices for illumination or display.

For example, Japanese Unexamined Patent Application Publication No. 2011-146640 discloses a light-emitting device which includes a chip-on-board (COB) light emitting module (light-emitting device) in which LEDs are mounted on a board and sealed with light-transmissive resin or a surface mount device (SMD) light-emitting element.

SUMMARY

A light-emitting device according to an aspect of the present disclosure includes: a board; and a plurality of light-emitting element arrays connected in parallel and each including a plurality of light-emitting elements mounted on the board and connected in series, the light-emitting elements in each of the plurality of light-emitting element array including one or more first light-emitting elements which emit light of a color and one or more second light-emitting elements which emit light of a color different from the color of the light emitted by the first light-emitting element. Each of the first light-emitting elements on the board is disposed non-successively to any other one of the first light-emitting elements in a first direction and in a second direction, the first direction being a direction along which the light-emitting elements included in one of the plurality of light-emitting element arrays including the first light-emitting element are arranged, and the second direction being a direction perpendicular to the first direction.

DETAILED DESCRIPTION OF THE PREFERRED EMBODIMENTS

Figure 1:
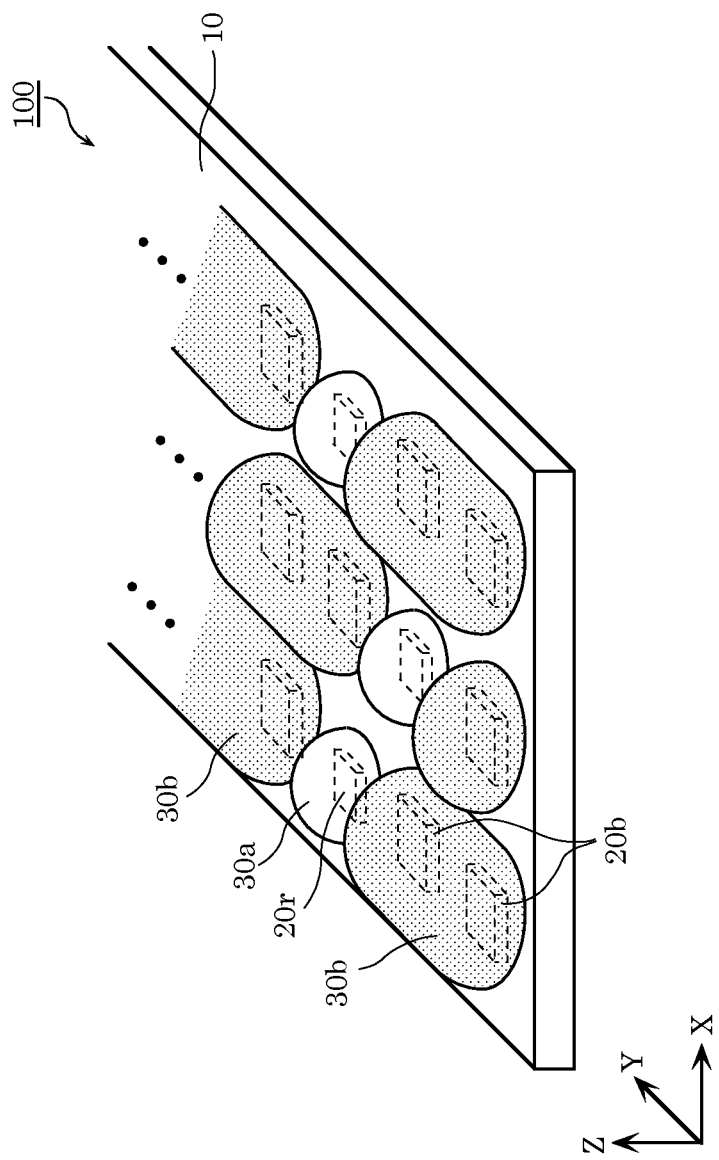
FIG. 1 illustrates a perspective external view of a light-emitting device according to a first embodiment.

This section starts with a description of a problem with light-emitting devices of the related art, and then a description of embodiments follows. Japanese Unexamined Patent Application Publication No. 2011-146640 discloses a light-emitting device including LEDs which emit different colors. The light-emitting device disclosed may emit light lacking in color uniformity due to use of LEDs of different colors.

The following describes light-emitting devices and others according to embodiments with reference to the drawings. Each of the embodiments described below shows a specific example for the present disclosure. The values, shapes, materials, constituent elements, layout and connection of the constituent elements, and others described for the embodiments are given for illustrative purposes only and do not limit the scope of inventive concept disclosed herein.

The drawings are schematic diagrams, and are therefore not necessarily exact. In the drawings, constituent elements substantially analogous are denoted with the same reference signs. Description of such constituent elements may be omitted or simplified for the second or later appearance of the constituent elements.

First Embodiment

Figure 2:
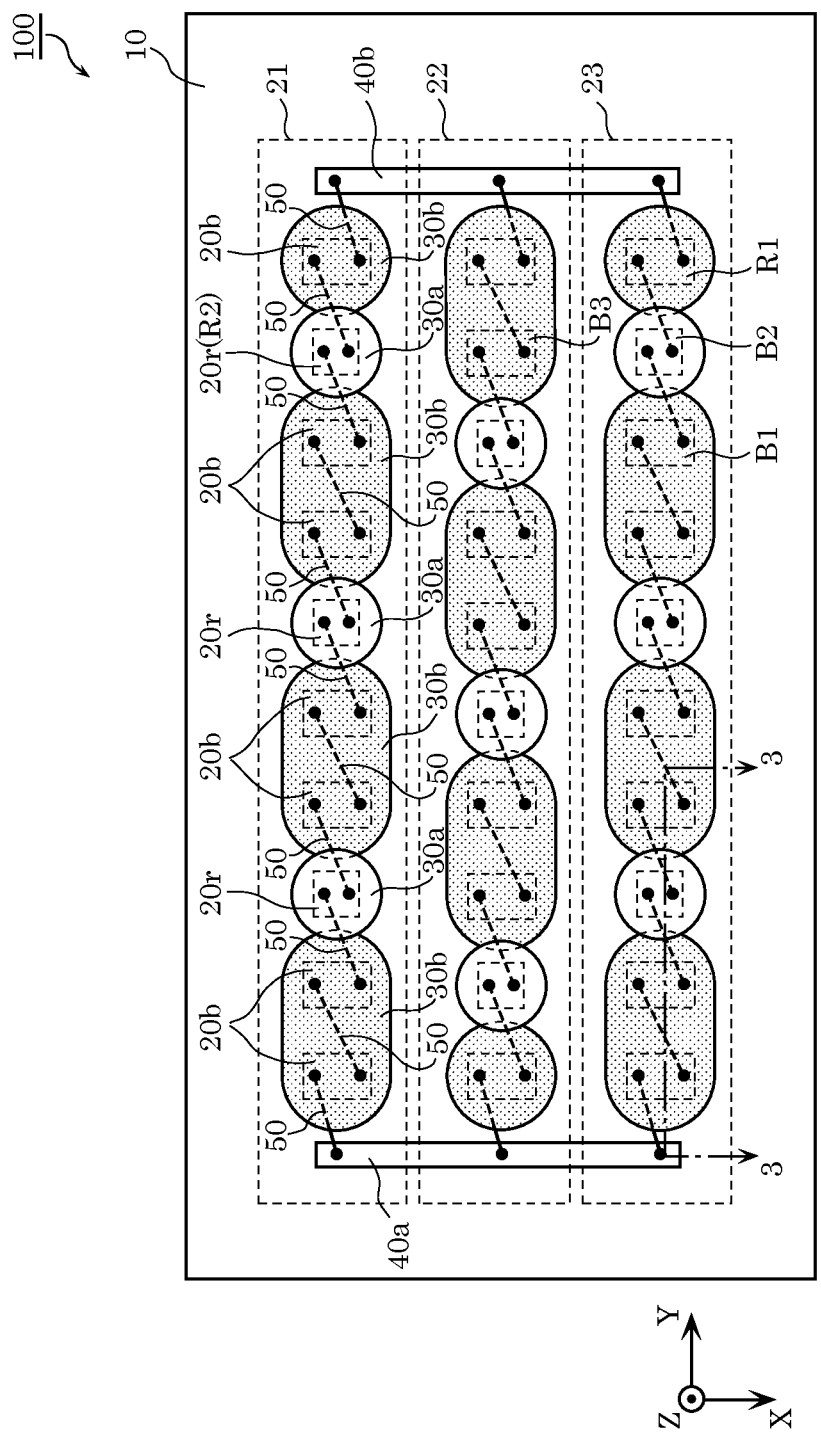
FIG. 2 illustrates a plan view of the light-emitting device according to the first embodiment.
Figure 3:
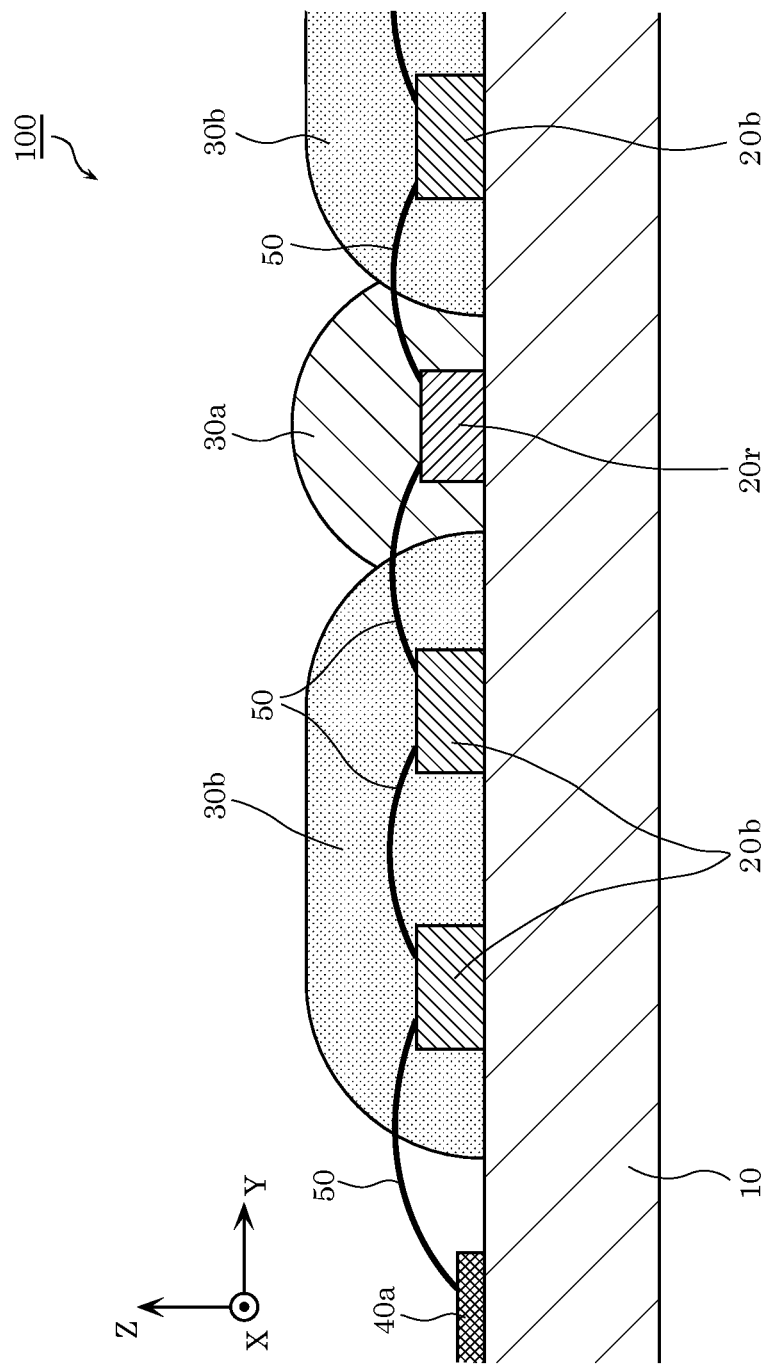
FIG. 3 illustrates a cross-sectional view of light-emitting device taken along the line 3-3 of FIG. 2.

The following describes a first embodiment.
[Light-Emitting Device]
The following describes a configuration of a light-emitting device according to the first embodiment with reference to the drawings. FIG. 1 illustrates a perspective external view of a light-emitting device according to the first embodiment. FIG. 2 illustrates a plan view of light-emitting device 100 according to the first embodiment. FIG. 3 illustrates a cross-sectional view of light-emitting device 100 taken along the line 3-3 of FIG. 2. In FIG. 1, illustration of bonding wires is omitted. FIG. 2 and FIG. 3 illustrate the configuration of the bonding wires differently for convenience of explanation.

As illustrated in FIG. 1 to FIG. 3, light-emitting device 100 includes board 10, first light-emitting element array 21, second light-emitting element array 22, and third light-emitting element array 23. First light-emitting element array 21, second light-emitting element array 22, and third light-emitting element array 23 each include a plurality of LED chips mounted on board 10.

Each of the light-emitting element arrays extends along a Y direction and includes a plurality of red LED chips 20r and a plurality of blue LED chips 20b. As illustrated in FIG.

2, each of the light-emitting element arrays includes three red LED chips 20r and seven blue LED chips 20b. In other words, each of the light-emitting element arrays of light-emitting device 100 includes the same number of red LED chips 20r, and each of the light-emitting element arrays of light-emitting device 100 includes the same number of blue LED chips 20b. Red LED chips 20r are an example of first light-emitting elements, and blue LED chips 20b are an example of second light-emitting elements.

The LED chips included in each of the light-emitting element arrays are aligned in a straight line along the Y direction (that is, along a longer side of board 10 having a rectangular shape). Furthermore, as illustrated in FIG. 2, the LED chips included in the light-emitting element arrays are aligned along an X direction (that is, along a shorter side of board 10 having a rectangular shape). In other words, the plurality of LED chips mounted on board 10 are arranged in a matrix.

As illustrated in FIG. 2 and FIG. 3, in each of the light-emitting element arrays, each of the LED chips has a cathode electrode connected to an anode electrode of a next LED chip with bonding wire 50. In other words, each of the light-emitting element arrays is an array of LED chips (electrically) connected in series.

Furthermore, the anode electrode (or the cathode electrode) of the LED chip at an end of each of the light-emitting element array is connected to line 40a (or line 40b) on board 10 with bonding wire 50. Line 40a and line 40b are supplied with power to cause each of the light-emitting element arrays to emit light. In other words, the light-emitting element arrays included in light-emitting device 100 are (electrically) connected in parallel.

Examples of metal materials for line 40a, line 40b, and bonding wire 50 include gold (Au), silver (Ag), and copper (Cu).

In each of the light-emitting element arrays, each of red LED chips 20r is sealed with a different dot of first sealant 30a, and blue LED chip 20b are sealed with second sealant 30b extending along the light-emitting element array to which blue LED chips 20b belong (or in the direction of the Y direction).

First sealant 30a is, for example, a transparent resin containing no phosphor, so that red light emitted from red LED chips 20r is output from first sealant 30a without being converted in wavelength (that is, without being converted in color).

Second sealant 30b is, for example, a resin containing a yellow phosphor as a wavelength converting material, so that blue light emitted from blue LED chips 20b is converted into white light by passing through second sealant 30b.

In this manner, light-emitting device 100 outputs red light emitted from red LED chips 20r in addition to white light produced by the combination of blue LED chip 20b and the yellow phosphor, so that light-emitting device 100 has increased color rendering quality.

As described above, light-emitting device 100 in the first embodiment is a what is called chip-on-board (COB) LED module, in which LED chips are directly mounted on board 10. The following describes constituent elements of light-emitting device 100.

[Board]

Board 10 is a metal-based board or a ceramic board, for example. Optionally, board 10 may be a resin board including resin as a base material.

Examples of the ceramic board include an alumina board made of aluminum oxide (alumina) and an aluminum nitride board made of aluminum nitride. Examples of the metal-based board include a board of an aluminum alloy, a board of an iron alloy, and a board of a copper alloy each having an insulating film on its surface. Examples of the resin board include a glass epoxy board made of glass fibers and epoxy resin.

Board 10 may be a board having high reflectivity (for example, a reflectivity of 90% or higher). When board 10 has such high reflectivity, light emitted from LED chips is reflected by the surface of board 10. Accordingly, light-emitting device 100 has increased light extraction efficiency. Examples of such a board include a white ceramic board including alumina as a base material.

Optionally, board 10 may be a translucent board having a high light transmittance. When board 10 is such a translucent board, light emitted from LED chips passes through board 10 and is also output from a face having no LED chips (rear face). Examples of such a board include a translucent ceramic board made of polycrystalline alumina or alumina nitride, a clear glass board made of glass, a crystal board made of crystal, a sapphire board made of sapphire, and a transparent resin board made of a transparent resin.

Board 10, which is described as being rectangular for the first embodiment, may be otherwise in shape such as a board having a circular shape.

[LED and Sealant]

The light-emitting elements mounted on board 10 include the plurality of red LED chips 20r and the plurality of blue LED chips 20b.

Red LED chips 20r and blue LED chips 20b are bare chips each emit monochromatic visible light. Examples of semiconductor light-emitting elements used as red LED chips 20r include semiconductor light-emitting elements which are made with an AlGaInP-based material and emit light having a center wavelength (or have a peak wavelength of an emission spectrum) ranging from approximately 630 nanometers to 645 nanometers, inclusive.

Examples of semiconductor light-emitting elements used as blue LED chips 20b include gallium nitride-based semiconductor light-emitting elements which are made with an InGaN-based material and emit light having a center wavelength (or have a peak wavelength of an emission spectrum) ranging from 430 nanometers to 500 nanometers.

As described above, in the first embodiment, each of red LED chips 20r is sealed with a different dot of first sealant 30a, and blue LED chips 20b are sealed with second sealant 30b extending along the light-emitting element array to which blue LED chips 20b belong. In other words, red LED chips 20r are each sealed with first sealant 30a formed in a dot shape in plan view, and blue LED chips 20b are sealed with second sealant 30b formed in a shape extending along the light-emitting element array in plan view.

First sealant 30a is made of a light-transmissive resin material such as silicone resin, so that light from red LED chips 20r passes through and is output from first sealant 30a. In other words, first sealant 30a does not function as a wavelength converter (color converter). First sealant 30a is provided to reduce refraction (or reduce total internal reflection of light passing from red LED chips 20r into air) so that the luminous efficiency of red LED chips 20r is increased and red LED chips 20r are protected.

Second sealant 30b is made of a light-transmissive resin material containing yellow phosphor particles. Examples of the light-transmissive resin material include silicone resin. Examples of the yellow phosphor particles include yttrium aluminum garnet (YAG)-based yellow phosphor particles.

In this configuration, part of blue light emitted from blue LED chips 20b is converted in wavelength into yellow light by the yellow phosphor particles contained in second sealant 30b. The center wavelength of the yellow light (or the peak wavelength of the emission spectrum of the yellow phosphor particles) is within a range from 545 nanometers to 570 nanometers, inclusive, for example.

Blue light not absorbed by the yellow phosphor particles and the yellow light converted in wavelength by the yellow phosphor particles diffuse and combine in second sealant 30b to produce white light which is output from second sealing member 30b.

In the first embodiment, the light-transmissive resin material for first sealant 30a and the light-transmissive resin material for second sealant 30b are substantially the same (both are silicone resin). In other words, second sealant 30b is made of a light-transmissive resin material for first sealant 30a to which a phosphor is added. Such use of the same light-transmissive resin material common for first sealant 30a and second sealant 30b contributes to reduction in material cost.

Optionally, first sealant 30a and second sealant 30b may include a light diffusing agent, such as silica, scattered in each of them. First sealant 30a and second sealant 30b need not be made of a resin material but may be made of an organic material such as fluorine-based resin or an inorganic material such as low-melting-point glass or sol-gel glass.

Optionally, the material for second sealant 30b, that is, a light-transmissive resin material containing yellow phosphor particles may be used as a material for first sealant 30a. The yellow phosphor does not convert red light emitted from red LED chip 20r in wavelength, so that the red light is still output from first sealant 30a containing the yellow phosphor.

First sealant 30a and second sealant 30b are made of a resin material which is applied from a dispenser and then cures. Accordingly, use of the same material for first sealant 30a and second sealant 30b increases efficiency of application of first sealant 30a and second sealant 30b.

In the first embodiment, each of the light-emitting element arrays, that is, first light-emitting element array 21, second light-emitting element array 22, and third light-emitting element array 23 includes the same number of red LED chips 20r, and includes the same number of blue LED chips 20b. In other words, light-emitting element arrays 21, 22, and 23 each include the number n of red LED chips 20r (n is an integer greater than or equal to one) and the number m of blue LED chips 20b (m is an integer greater than or equal to one). In this configuration, operating voltage applied across each of light-emitting element arrays 21, 22, and 23 falls within a predetermined range. The ratio of the number of red LED chips 20r mounted on board 10 to the number of blue LED chips 20b, which is described as being 3:7 for the first embodiment, may be otherwise. The ratio of the number of red LED chips 20r to the number of blue LED chips 20b is typically set to n:m=1:k (1≤k≤2) or so. In other words, the number of red LED chips 20r mounted on board 10 is less than or equal to the number of blue LED chips 20b mounted on board 10.

Furthermore, as illustrated in FIG. 3, first sealant 30a is above second sealant 30b (or on a positive side of second sealant 30b along the Z axis) at interfaces between first sealant 30a and second sealant 30b. In other words, in light-emitting device 100, first sealant 30a partly covers second sealant 30b. This is because in manufacturing of light-emitting device 100 in the first embodiment, application of second sealing member 30b to seal blue LED chips 20b precedes application of first sealant 30a.

If application of first sealant 30a precedes application of second sealant 30b, sealing of blue LED chips 20b with second sealing member 30b may be incomplete due to presence of first sealant 30a already applied. In such a case, part of blue light emitted from blue LED chips 20b may not even enter second sealant 30b but only enter first sealant 30a to be output from first sealant 30a.

As described above, first sealant 30a does not convert light in wavelength. Therefore, light-emitting device 100 may have color shift of white light (color shift with respect to a designed value) due to leaking blue light output after passing through only first sealant 30a.

Compared to this, if application of second sealing member 30b to seal blue LED chips 20b precedes application of first sealant 30a as in the first embodiment, risk of such color shift due to leaking blue light is reduced.

[Features of Light-Emitting Device]

The following describes features of light-emitting device 100 with reference to FIG. 2.

The feature of light-emitting device 100 is that red LED chips 20r on board 10 are arranged sparsely on board 10. More specifically, each of red LED chips 20r on board 10 is disposed non-successively to any other one of red LED chips 20r in a first direction along which the LED chips included in the light-emitting element array including red LED chip 20r are arranged (that is, in the Y direction) and in a second direction which is perpendicular to the first direction (that is, in the X direction). More specifically, in first light-emitting element array 21 including red LED chips 20r, each of red LED chips 20r has none of other red LEDs 20R disposed next to itself in the first direction (along the Y direction) or in the second direction (along the X direction). Also in second light-emitting element array 22 and third light-emitting element array 23, each of red LED chips 20r has none of other red LEDs 20R disposed next to itself in the first direction (along the Y direction) or in the second direction (along the X direction).

In other words, in light-emitting device 100, red LED chips 20r on board 10 are disposed non-successively in the first direction and in the second direction. The first direction is one of a direction along a column of a matrix of LED chips and a direction along a row of the matrix, and the second direction is the other of the direction along the column of the matrix and the direction along the row of the matrix.

For example, red LED chip R1 in FIG. 2 is disposed successively to blue LED chip B1 and blue LED chip B2 in the first direction, and is disposed successively to none of other red LED chips 20r in the first direction.

Furthermore, red LED chip R1 is disposed successively to blue LED chip B3 in the second direction, and is disposed successively to none of other red LED chips 20r in the second direction.

When second light-emitting element array 22 is provided without blue LED chip B3 disposed at the position illustrated in FIG. 2, red LED chip R1 is considered as having no other LED chip next to itself in the second direction. Thus, in this case, red LED chip R1 and red LED chip R2 are considered as being disposed non-successively.

Blue LED chip B3 may be positioned farther in the positive or negative Y direction than illustrated in FIG. 2, so that the center of red LED chip R1 and the center of blue LED chip B3 are substantially misaligned along the first direction (Y direction). Being "substantially misaligned" refers to distinct misalignment beyond misalignment due to acceptable error in actual operation of mounting. In this case, red LED chip R1 and blue LED chip B3 are considered as being disposed non-successively.

[Advantageous Effects Etc.]

As described above, light-emitting device 100 includes board 10 and the plurality of first light-emitting element arrays. Each of the light-emitting element arrays is an array of LED chips including red LED chips 20r and blue LED chips 20b mounted on board 10 and connected in series. The light-emitting element arrays are connected in parallel.

In light-emitting device 100, each of red LED chips 20r on board 10 is disposed non-successively to any other one of red LED chips 20r in the first direction along which the LED chips included in the light-emitting element array including red LED chip 20r are arranged and in the second direction perpendicular to the first direction.

In this configuration, unevenness in distribution of red LED chips 20r on board 10 is reduced, so that light-emitting device 100 has increased color rendering quality and emits light with higher color uniformity.

[First Variation]

As described above, in the first embodiment, each of red LED chips 20r is sealed with a different dot of first sealant 30a, and blue LED chips 20b are sealed with second sealant 30b extending along the light-emitting element array to which blue LED chips 20b belong. Such a manner of sealing of red LED chips 20r and blue LED chips 20b is not limiting.

Figure 4:
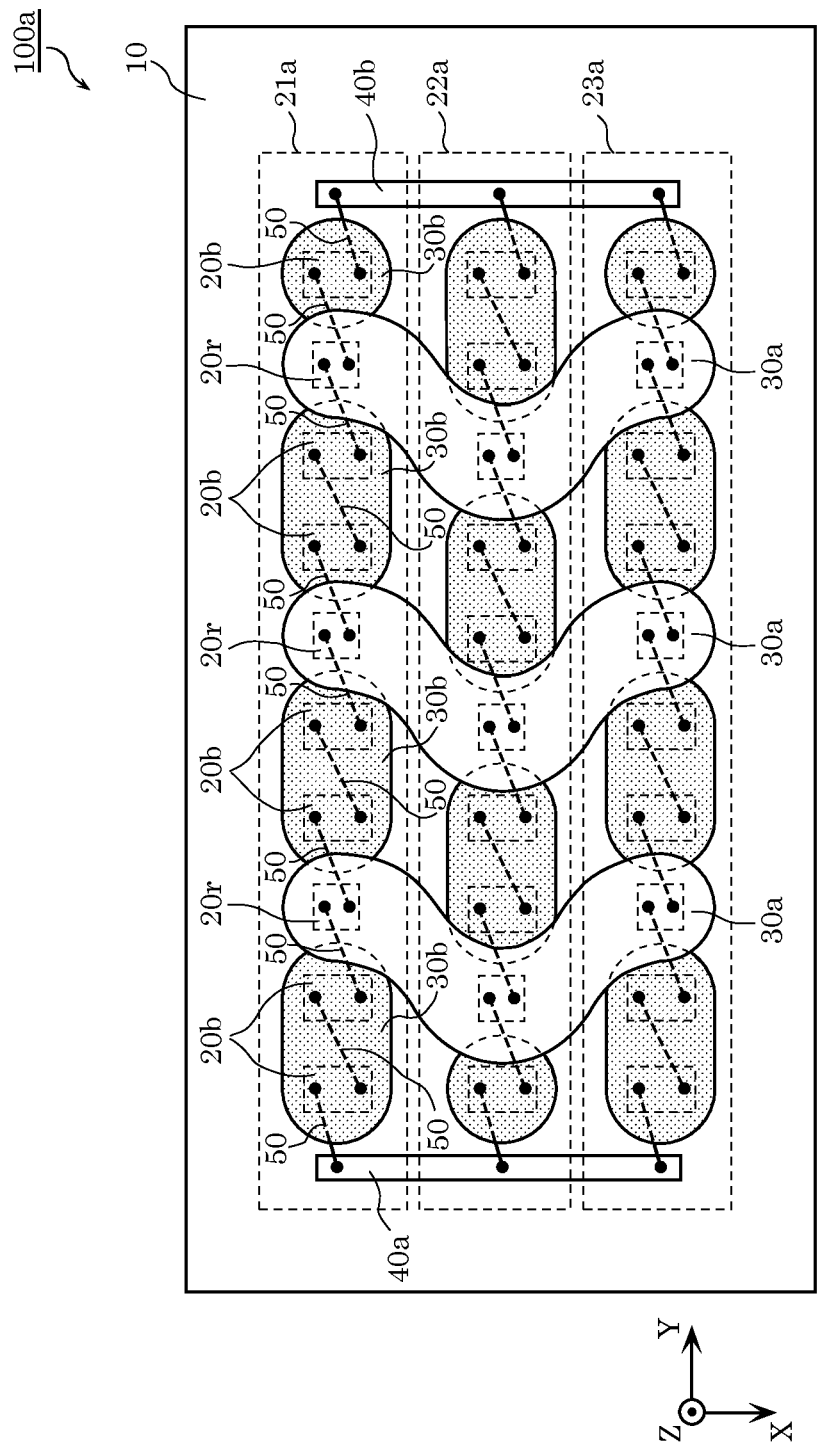
FIG. 4 illustrates a plan view of a light-emitting device in which a plurality of red LED chips are sealed together across a plurality of light-emitting element arrays.
Figure 5:
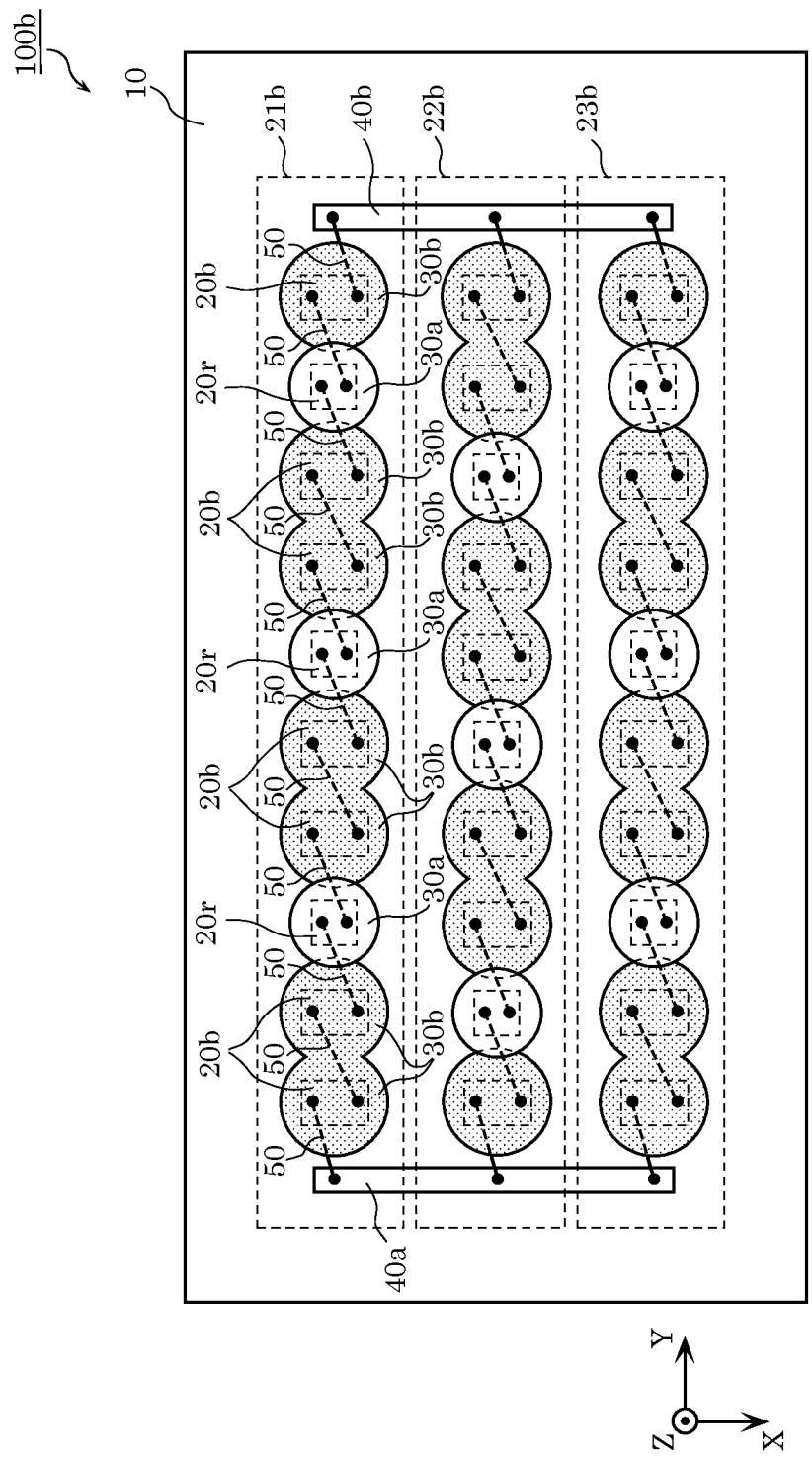
FIG. 5 illustrates a plan view of a light-emitting device in which LED chips and blue LED chips are each sealed with a different dot of resin.

The following describes a first variation of light-emitting device 100 according to the first embodiment. FIG. 4 illustrates a plan view of a light-emitting device in which a plurality of red LED chips 20r are sealed together across a plurality of light-emitting element arrays. FIG. 5 illustrates a plan view of a light-emitting device in which each of red LED chips 20r and blue LED chips 20b is sealed with a different dot of resin. Hereinafter, description of constituent elements substantially analogous to the constituent elements of light-emitting device 100 is omitted.

As in light-emitting device 100a illustrated in FIG. 4, red LED chips 20r may be sealed together across a plurality of light-emitting element arrays (first light-emitting element array 21a, second light-emitting element array 22a, and third light-emitting element array 23a).

Thus, a group of red LED chips 20r arranged sparsely on board 10 is sealed together in a single line of resin. Application of first sealant 30a to seal red LED chips 20r in this manner is efficient. Furthermore, in this configuration, first sealant 30a stretching between the light-emitting element arrays serves as a light guide member. Thus, in light-emitting device 100a, red light emitted from red LED chips 20r is guided to the space between the light-emitting element arrays, so that the degree of color mixture of red light in light-emitting device 100a (or color uniformity) is increased.

Optionally, as in light-emitting device 100b illustrated in FIG. 5, each of red LED chips 20r and blue LED chips 20b may be sealed with a (domical) dot of resin in each of the light-emitting element arrays (first light-emitting element array 21b, second light-emitting element array 22b, and third light-emitting element array 23b).

Such a way of application of first sealant 30a and second sealant 30b is efficient and of a high degree of freedom. When the sealant is applied in dots, the required amount of sealant is small compared to the case where sealant is linearly applied along a light-emitting element array. Such a way of application of sealant in dots is therefore advantageous in terms of material cost.

Red LED chips 20r are arranged on board 10 more evenly, so that above-described light-emitting device 100a and light-emitting device 100b emit light with higher color uniformity.

Optionally, red LED chips 20r and blue LED chips 20b may be sealed in a manner different from the above-described one.

[Second Variation]

In the above-described first embodiment, the LED chips including red LED chips 20r and blue LED chips 20b mounted on board 10 are connected in series, chip to chip, by bonding wires 50. Optionally, the LED chips may be connected via a line (metal film) provided on board 10.

Figure 6:
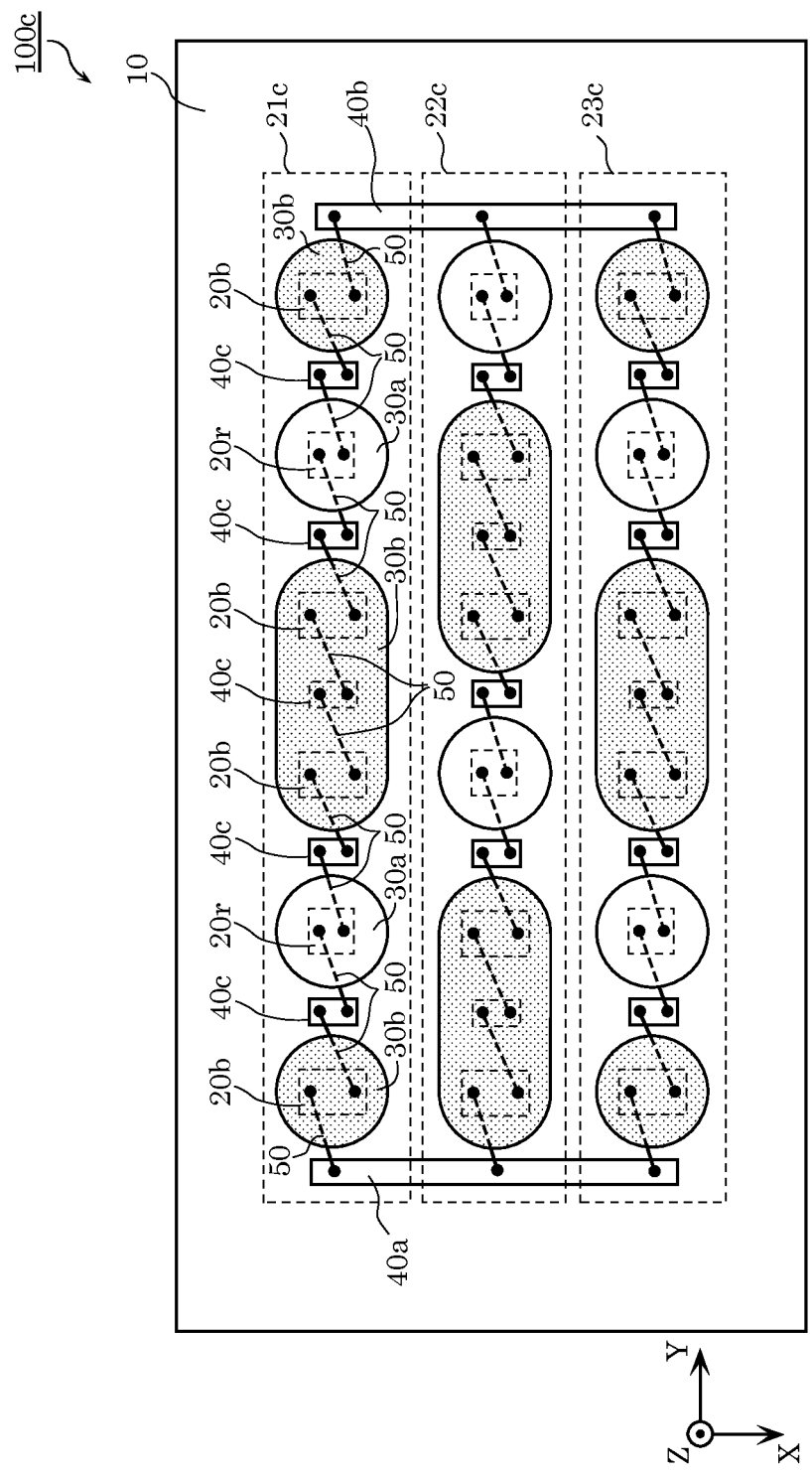
FIG. 6 illustrates a plan view of a light-emitting device in which a plurality of LED chips are connected via lines provided on a board.

The following describes a second variation of light-emitting device 100 according to the first embodiment. FIG. 6 illustrates a plan view of a light-emitting device in which a plurality of LED chips are connected via lines provided on board 10. Hereinafter, description of constituent elements substantially analogous to the constituent elements of light-emitting device 100 is omitted.

As illustrated in FIG. 6, light-emitting device 100c includes first light-emitting element array 21c, second light-emitting element array 22c, and third light-emitting element array 23c.

In each of the light-emitting element arrays in light-emitting device 100c, bonding wire 50 connects the cathode electrode of an LED chip (first LED chip) to line (bonding pad) 40c provided between first LED chip and an LED chip next to the first LED chip (second LED chip). Line 40c and the anode electrode of the second LED chip are connected with bonding wire 50. In other words, each of the light-emitting element arrays in light-emitting device 100a is an array of LED chips (electrically) connected in series via lines provided on board 10.

Furthermore, the LED chip at either end of each of the light-emitting element arrays is connected to line 40a (or line 40b) on board 10 with bonding wire' 50 as illustrated in FIG. 6. Line 40a and line 40b are supplied with power to cause each of the light-emitting element arrays to emit light.

In each of the light-emitting element arrays, each of red LED chips 20r is sealed with a different dot of resin, and blue LED chips 20b are sealed with second sealant 30b extending along the light-emitting element array to which blue LED chips 20b belong (or in the direction of the Y direction). The LED chips may be sealed with any of the above-described manner or other.

Red LED chips 20r are arranged on board 10 more evenly, so that above-described light-emitting device 100c emits light with higher color uniformity.

Second Embodiment

Figure 7:
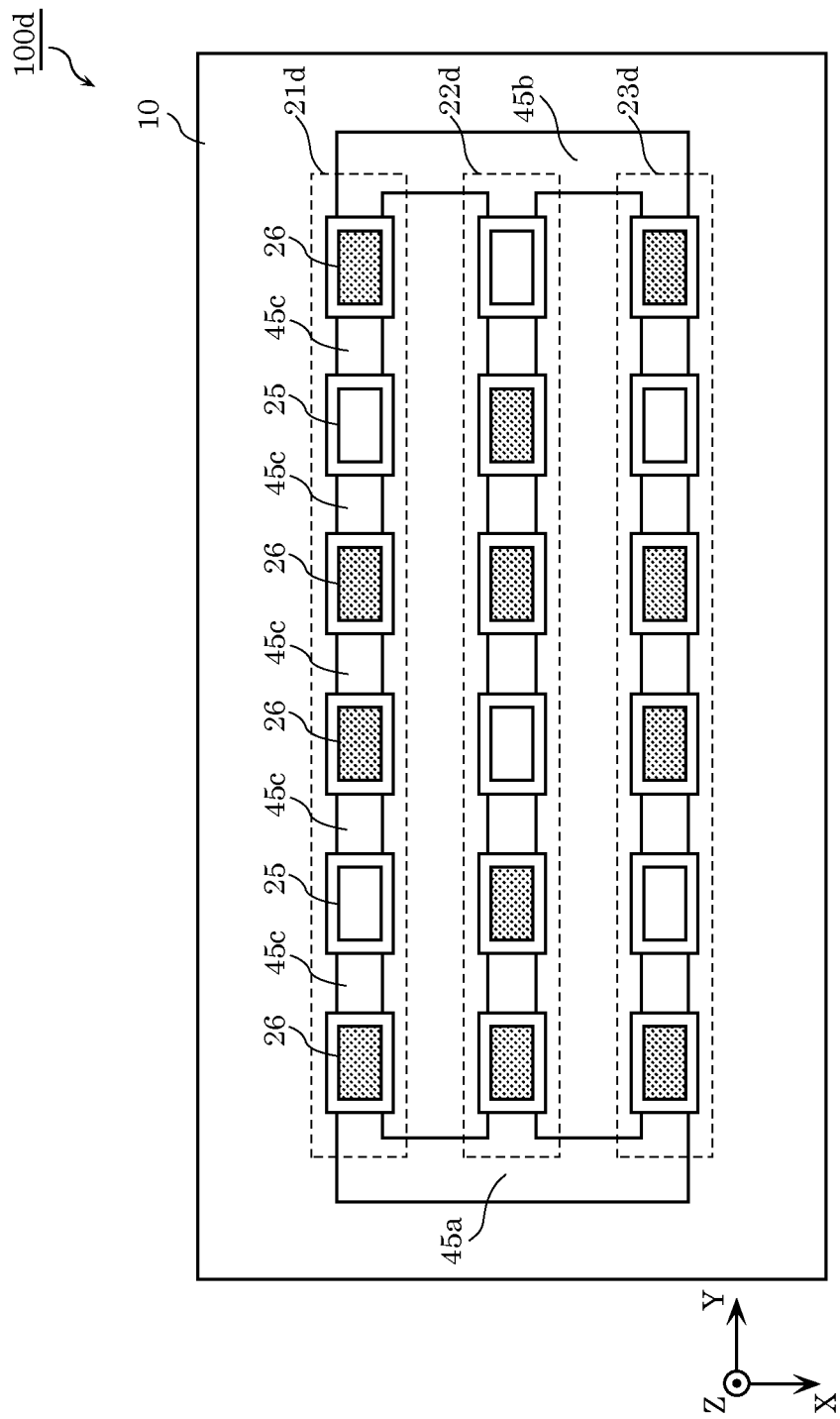
FIG. 7 illustrates a plan view of a light-emitting device including SMD LEDs.

In the first embodiment, LED chips are used as light-emitting elements included in light-emitting device 100. Optionally, surface mount device (SMD) LED elements (hereafter referred to as SMD LEDs) may be used as light-emitting elements included in light-emitting device 100. FIG. 7 illustrates a plan view of a light-emitting device including SMD LEDs.

Light-emitting device 100d illustrated in FIG. 7 has a basic configuration common to the basic configuration of light-emitting device 100 according to the first embodiment described with reference to FIG. 1 to FIG. 6. Light-emitting device 100d is different from light-emitting device 100 in that light-emitting elements included in light-emitting device 100d are SMD LEDs (first SMD LEDs 25 and second SMD LEDs 26).

As illustrated in FIG. 7, light-emitting device 100d includes board 10, first light-emitting element array 21d, second light-emitting element array 22d, and third light-emitting element array 23d. Each of first light-emitting element arrays 21d, second light-emitting element array 22d, and third light-emitting element array 23d includes a plurality of LED chips mounted on board 10.

Each of the light-emitting element arrays extends along the Y direction and includes a plurality of first SMD LEDs 25 and a plurality of second SMD LEDs 26. As illustrated in FIG. 7, each of the light-emitting element arrays includes two first SMD LEDs 25 and four second SMD LEDs 26. First SMD LEDs 25 are an example of first light-emitting elements, and second SMD LEDs 26 are an example of second light-emitting elements.

The plurality of SMD LEDs mounted on board 10 are arranged in a matrix. In each of the light-emitting element arrays, each of the SMD LEDs has a cathode electrode connected to an anode electrode of a next SMD LED with line 45c provided on board 10. In other words, each of the light-emitting element arrays is an array of SMD LEDs (electrically) connected in series.

Furthermore, the anode electrode (or the cathode electrode) of the SMD LED at either end of each of the light-emitting element array is connected to line 45a (or line 45b) on board 10. Line 45a and line 45b are supplied with power to cause each of the light-emitting element arrays to emit light. In other words, the light-emitting element arrays included in light-emitting device 100d are (electrically) connected in parallel.

Figure 8:
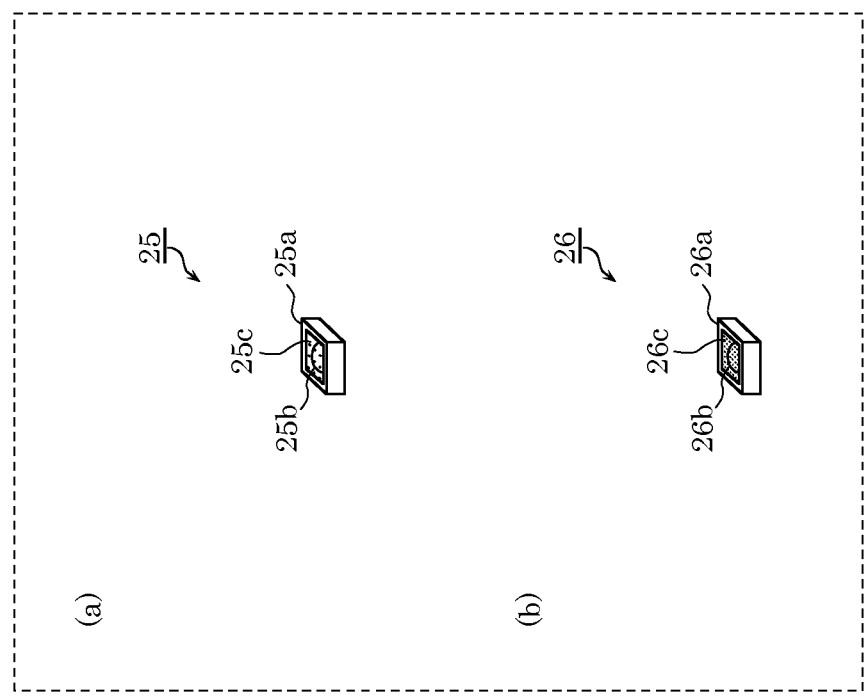
FIG. 8 illustrates a schematic configuration of a first SMD LED and a second SMD LED.

The following describes the SMD LEDs (first SMD LEDs 25 and second SMD LEDs 26). FIG. 8 illustrates a schematic configuration of first SMD LED 25 and second SMD LED 26.

First SMD LED 25 includes first casing 25a and red LED chip 25b placed in first casing 25a. Second SMD LED 26 includes second casing 26a and blue LED chip 26b placed in second casing 26a.

More specifically, first SMD LED 25 further includes first sealant 25c in first casing 25a. First sealant 25c increases luminous efficiency of red LED chip 25b and protect red LED chip 25b. As with first sealant 30a in the first embodiment, first sealant 25c is made of a light-transmissive resin material such as silicone resin, so that light from red LED chips 25b passes through and is output from first sealant 25c. Thus, first SMD LEDs 25 emits red light.

Furthermore, second SMD LED 26 further includes second sealant 26c in second casing 26a. Second sealant 26c converts light emitted from blue LED chip 26b in wavelength. Second sealant 26c is made of a light-transmissive resin material such as silicone resin and contains yellow phosphor particles. Thus, second SMD LEDs 26 emits white light.

In this manner, light-emitting device 100d emits red light from first SMD LEDs 25 in addition to white light emitted from second SMD LEDs 26, so that light-emitting device 100d has increased color rendering quality.

Furthermore, as illustrated in FIG. 7, each of first SMD LEDs 25 on board 10 is disposed non-successively to any other one of first SMD LEDs 25 in a first direction along which SMD LEDs 25 included in the light emitting array including first SMD LED 25 are arranged (that is, in the Y direction) and in a second direction which is perpendicular to the first direction (that is, in the X direction).

In this configuration, unevenness in distribution of first SMD LEDs 25 which emit red light on board 10 is reduced, so that light-emitting device 100d has increased color rendering quality and emits light with higher color uniformity.

Third Embodiment

Figure 9:
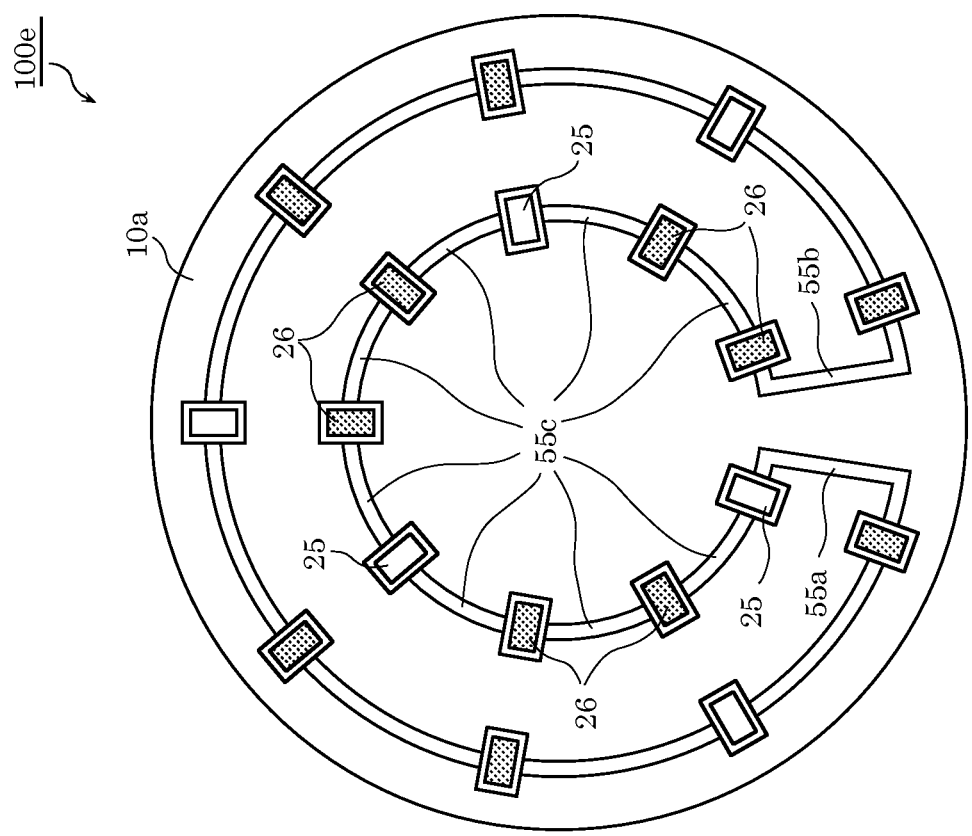
FIG. 9 illustrates a first plan view of a light-emitting device in which a plurality of light-emitting elements arranged in circles.

In the light-emitting devices according to the above-described embodiments, each of the light-emitting element arrays is an array of light-emitting elements arranged in a straight line. Optionally, each of the light-emitting element arrays may be an array of light-emitting elements arranged in a circle or along a circular arc. FIG. 9 illustrates a first plan view of a light-emitting device in which a plurality of light-emitting elements arranged in circles.

FIG. 9 illustrates light-emitting device 100e including board 10a and SMD LEDs mounted on board 10a. Board 10a is circular in plan view. The SMD LEDs forms two light-emitting element arrays circular in shape. Hereinafter, the inner one of the two light-emitting element arrays is also referred to as an inner light-emitting element array, and the inner one of the two light-emitting element array is also referred to as an outer light-emitting element array.

Each of the light-emitting element arrays includes first SMD LEDs 25 and second SMD LEDs 26. First SMD LEDs 25 and second SMD LEDs 26 are arranged in a circle. As illustrated in FIG. 9, each of the light-emitting element arrays includes three of first SMD LEDs 25 and six of second SMD LEDs 26, and these SMD LEDs are arranged in a circle.

The SMD LEDs in different light-emitting element arrays are aligned along radii. The circle defined by the inner light-emitting element array and the circle defined by the outer light-emitting element array are concentric. In other words, SMD LEDs on board 10a are arranged in concentric circles.

In each of the light-emitting element arrays, each of the SMD LEDs has a cathode electrode connected to an anode electrode of a next SMD LED with line 55c provided on board 10a. In other words, each of the light-emitting element arrays is an array of SMD LEDs (electrically) connected in series.

Furthermore, the anode electrode (or the cathode electrode) of the SMD LED at either end of each of the light-emitting element array is connected to line 55a (or line 55b) on board 10a. Line 55a and line 55b are supplied with power to cause each of the light-emitting element arrays to emit light. In other words, the light-emitting element arrays included in light-emitting device 100e are (electrically) connected in parallel.

Furthermore, as illustrated in FIG. 9, each of first SMD LEDs 25 on board 10a is disposed non-successively to any other one of first SMD LEDs 25 in a first direction along which first SMD LEDs 25 included in the light emitting array including first SMD LED 25 are arranged (that is, in the circumferential direction) and in a second direction perpendicular to the first direction (that is, in the radial direction).

In this configuration, unevenness in distribution of first SMD LEDs 25 which emit red light on board 10a is reduced, so that light-emitting device 100e has increased color rendering quality and emits light with higher color uniformity.

Figure 10:
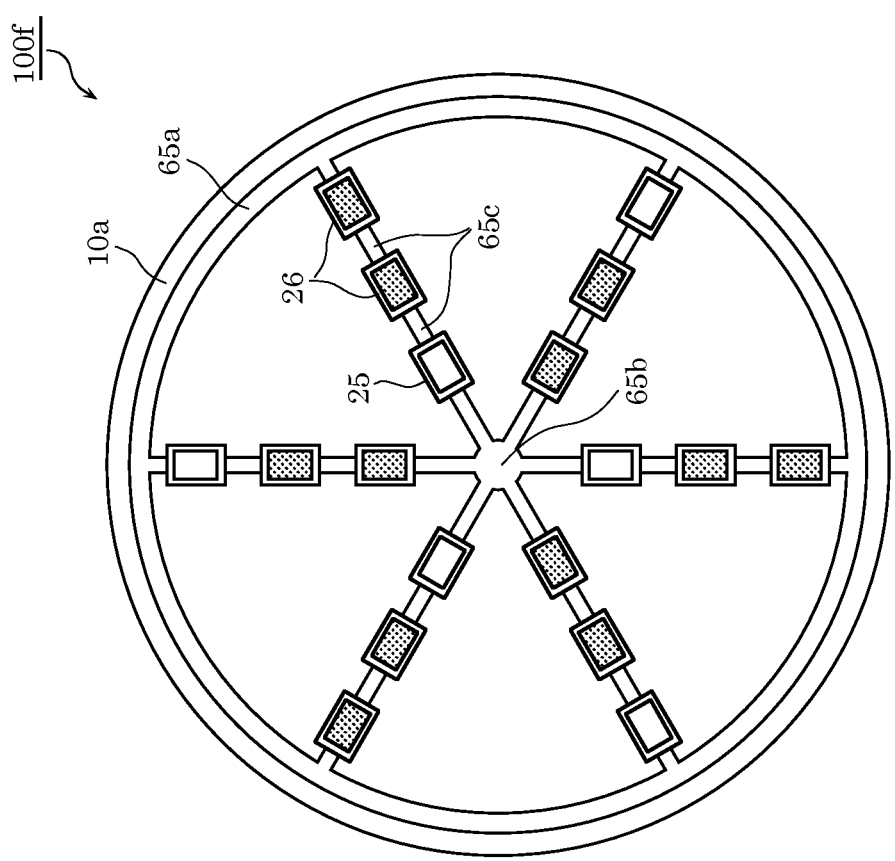
FIG. 10 illustrates a second plan view of a light-emitting device in which a plurality of light-emitting elements arranged in circles.

Optionally, SMD LEDs arranged in concentric circles may be arranged and electrically connected as illustrated in FIG. 10. FIG. 10 illustrates a second plan view of a light-emitting device in which a plurality of light-emitting elements arranged in circles.

FIG. 10 illustrates light-emitting device 100f including board 10a and SMD LEDs mounted on board 10a. More specifically, board 10a has six linear light-emitting element arrays radially arranged thereon.

Each of the light-emitting element arrays includes one of first SMD LEDs and two of second SMD LEDs arranged in a straight line. The SMD LEDs in different light-emitting element arrays are aligned with respect to the circumferences. Thus, also in the configuration illustrated in FIG. 10, the SMD LEDs are arranged in circles (concentrically).

In each of the light-emitting element arrays, each of the SMD LEDs has a cathode electrode connected to an anode electrode of a next SMD LED with line 65c provided on board 10a. In other words, each of the light-emitting element arrays is an array of LED chips (electrically) connected in series.

Furthermore, the anode electrode (or the cathode electrode) of the SMD LED at either end of each of the light-emitting element array is connected to line 65a having a circular shape (or line 65b having a dot shape) on board 10a. Line 65a and line 65b are supplied with power to cause each of the light-emitting element arrays to emit light. In other words, the light-emitting element arrays included in light-emitting device 100f are (electrically) connected in parallel.

Furthermore, as illustrated in FIG. 10, each of first SMD LEDs 25 on board 10a is disposed non-successively to any other one of first SMD LEDs 25 in a first direction along which first SMD LEDs 25 included in the light emitting array including first SMD LED 25 are arranged (that is, in the radial direction) and in a second direction perpendicular to the first direction (that is, in the circumferential direction).

In this configuration, unevenness in distribution of first SMD LEDs 25 which emit red light on board 10a is reduced, so that light-emitting device 100f has increased color rendering quality and emits light with higher color uniformity.

As described above for the third embodiment, a plurality of light-emitting elements on board 10a may be arranged concentrically. In this case, the first direction, along which the light-emitting elements in a light-emitting element array are aligned, may be one of a circumferential direction and a radial direction in a concentric configuration, and the second direction may be the other of the circumferential direction and the radial direction in the concentric configuration.

In the above-described example for the third embodiment, SMD LEDs are used as light-emitting elements. Similarly, a plurality of light-emitting elements in a chip-on-board (COB) light-emitting device may be arranged concentrically.

Fourth Embodiment

Figure 11:
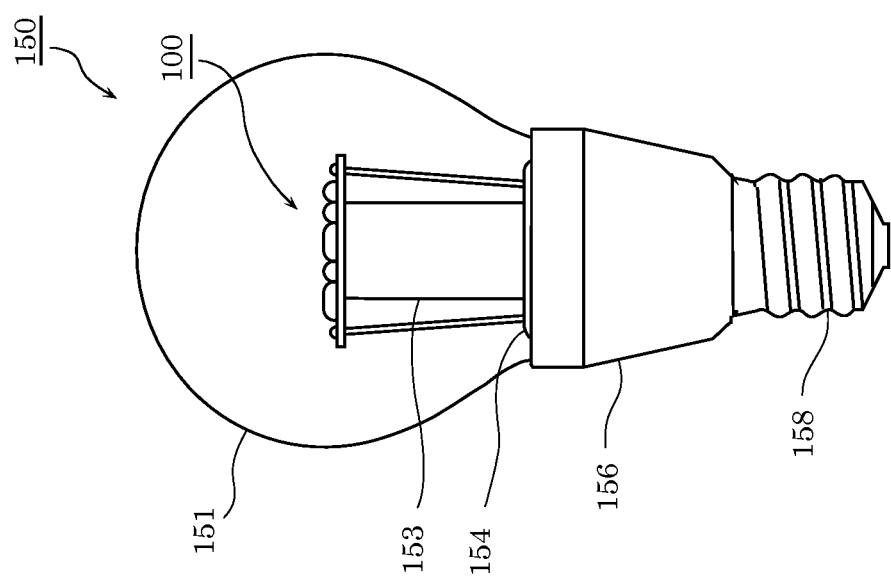
FIG. 11 illustrates a schematic configuration of a bulb lamp according to a fourth embodiment.

The following describes a configuration of bulb lamp 150 according to the fourth embodiment with reference to FIG. 11.

FIG. 11 illustrates a schematic configuration of bulb lamp 150 according to the fourth embodiment.

Bulb lamp 150 illustrated in FIG. 11 is an example of an illumination light source and includes light-emitting device 100 according to the first embodiment.

Bulb lamp 150 includes bulb 151, light-emitting device 100, chassis 156, and cap 158. Bulb 151 is light-transmissive. Light-emitting device 100 is a light source. Chassis 156 contains a driver circuit through which power is supplied to light-emitting device 100. Cap 158 receives power from outside bulb lamp 150.

Cap 158 receives alternating-current (AC) power, and the driver circuit converts the AC power into direct-current (DC) power and supplies the DC power to light-emitting device 100. When the power supplied through cap 158 is DC power, the driver circuit need not be capable of AC-to-DC conversion.

In the fourth embodiment, light-emitting device 100 is supported by stem 153 so that light-emitting device 100 is positioned at the central part of bulb 151. Stem 153 is a metal rod extending from near the opening of bulb 151 inward bulb 151.

More specifically, stem 153 is connected to support board 154 disposed near the opening of bulb 151.

Optionally, light-emitting device 100 may be supported directly by support board 154 instead of stem 153. In other words, light-emitting device 100 may be mounted on a face of support board 154 facing the inner side of bulb 151.

Bulb 151 is a light-transmissive cover which transmits light from light-emitting device 100 to outside. Bulb 151 in the fourth embodiment is made of a material transparent to light from light-emitting device 100. Examples of such bulb 151 include a glass bulb (clear bulb) of silica glass transparent to visible light.

In this case, light-emitting device 100 contained in bulb 151 is visible from outside bulb 151.

Bulb 151 need not be transparent to visible light and may diffuse light. For example, bulb 151 may have a white light-diffusing film which is formed by applying white pigment or resin including a light diffuser such as silica or calcium carbonate to the interior or exterior of bulb 151. The material for bulb 151 is not limited to glass. Resin may be used as a material for bulb 151. Examples of the resin include synthetic resin such as acrylic (polymethylmethacrylate or PMMA) and polycarbonate (PC).

The shape of bulb 151 is not limited to a particular shape. For example, when light-emitting device 100 is supported directly by support board 154 (that is, when light-emitting device 100 does not include stem 153), bulb 151 may be hemispherical.

Including light-emitting device 100 according to the first embodiment, bulb lamp 150 emits light with increased color uniformity and is capable of being manufactured with increased productivity.

Bulb lamp 150 is an example of an illumination light source including light-emitting device 100 according to the first embodiment for the fourth embodiment. An illumination light source including light-emitting device 100 may be also implemented as a straight tube lamp.

Furthermore, the light-emitting devices described for the first embodiment to the third embodiment may be included in bulb lamp 150 (illumination light source) instead of light-emitting device 100.

Fifth Embodiment

Figure 12:
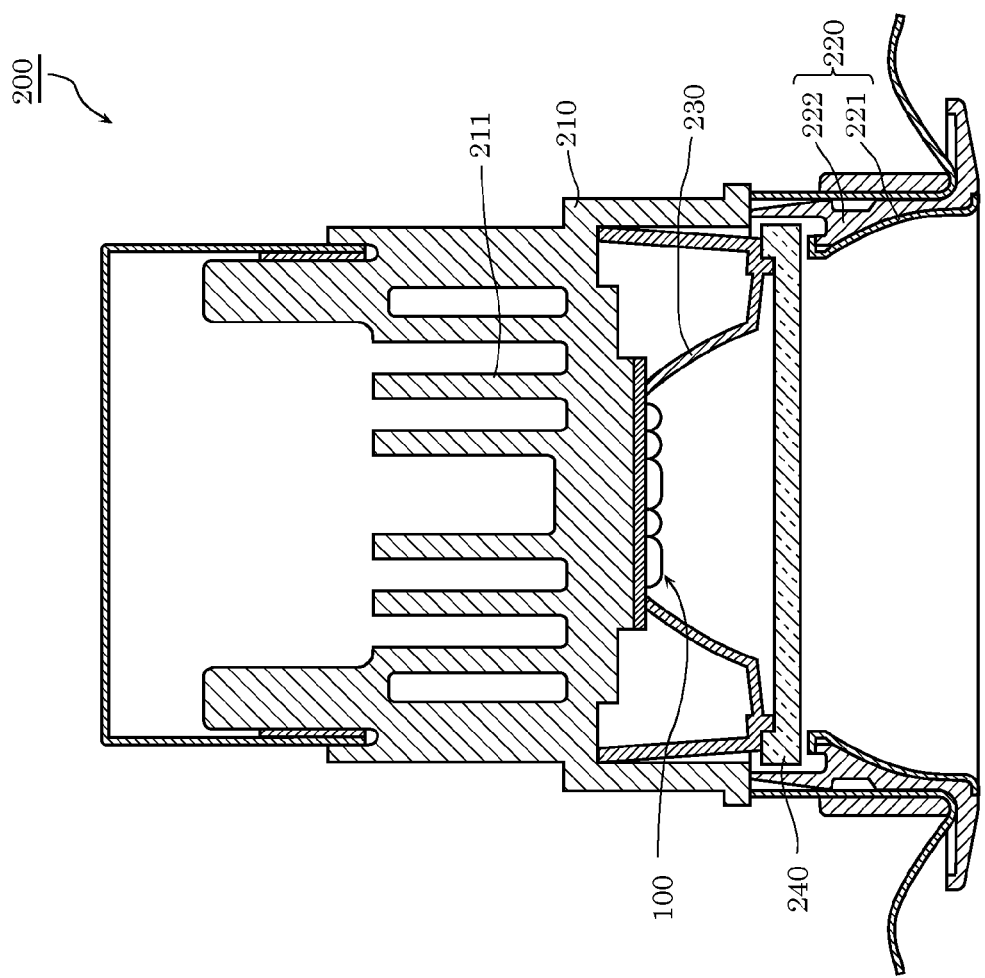
FIG. 12 illustrates a cross-sectional view of an illumination device according to a fifth embodiment.
Figure 13:
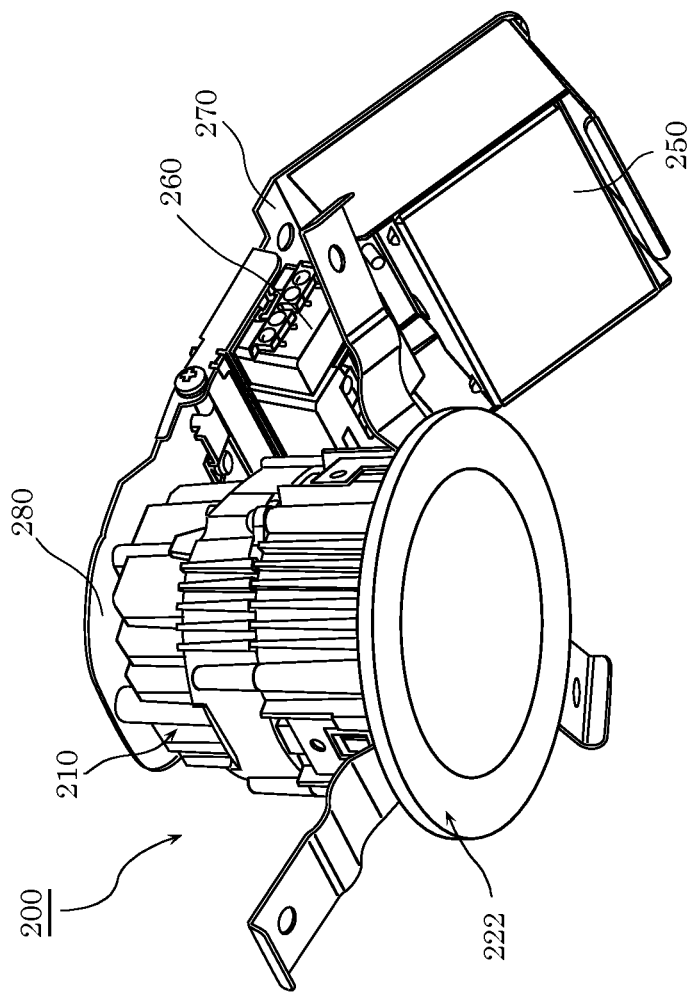
FIG. 13 illustrates a perspective external view of the illumination device according to the fifth embodiment.

The following describes a configuration of illumination device 200 according to a fifth embodiment with reference to FIG. 12 and FIG. 13.

FIG. 12 illustrates a cross-sectional view of illumination device 200 according to the fifth embodiment.

FIG. 13 illustrates a perspective external view of illumination device 200 according to the fifth embodiment.

As illustrated in FIG. 12 and FIG. 13, illumination device 200 according to the fifth embodiment is a recessed illumination device. For example, illumination device 200 is a downlight embedded in a ceiling of a house and emits light downward (toward a floor or a wall).

Illumination device 200 includes light-emitting device 100 according to the first embodiment. Illumination device 200 further includes a device body, reflective plate 230, and light-transmissive panel 240. The device body includes base unit 210 and frame unit 220 coupled together and substantially has a shape of a bottomed cylinder. Reflective plate 230 and light-transmissive panel 240 are installed on the device body.

Base unit 210 is a base on which light-emitting device 100 is installed and is a heatsink to dissipate heat generated by light-emitting device 100. Base unit 210 is made of a metal material and is substantially columnar in shape. Base unit 210 in the fifth embodiment is formed of die-cast aluminum.

The upper part (the portion in the ceiling) of base unit 210 includes radiation fins 211 extending upward and arranged parallel to one another at fixed intervals. These radiation fins 211 allow for efficient dissipation of heat generated by light-emitting device 100.

Frame unit 220 includes cone part 221 and frame body 222 to which cone part 221 is coupled. Cone part 221 is substantially cylindrical and has a reflective interior surface. Cone part 221 is formed of a metal material, and is made by raising or stamping an aluminum alloy, for example. Frame body 222 is formed of a hard resin or a metal material. Frame body 222 is coupled to base unit 210, so that frame unit 220 is fixed.

Reflective plate 230 is a hollow-conical (or funnel-shaped) reflector of internal reflection. Reflective plate 230 is formed of, for example, a metal material such as aluminum. Optionally, reflective plate 230 may be formed of a hard white resin material instead of a metal material.

Light-transmissive panel 240 is a light-transmissive member which diffuses and transmits light. Light-transmissive panel 240 is a planar plate disposed between reflective plate 230 and frame body 220, and is coupled to reflective plate 230. Light-transmissive panel 240 is made of a transparent resin material, such as acrylic or polycarbonate, formed into a disc.

Illumination device 200 need not include light-transmissive panel 240. When illumination device 200 does not include light-transmissive panel 240, light emitted from illumination device 200 has an increased luminous flux.

Furthermore, illumination device 200 is connected with lighting power supply 250 and terminal block 260. Lighting power supply 250 supplies lighting power to light-emitting device 100 as illustrated in FIG. 13. Terminal block 260 relays alternating-current power from a commercial power source to lighting power supply 250.

Lighting power supply 250 and terminal block 260 are fastened to mounting board 270 which is a part separate from the device body. Mounting board 270 is a rectangular metal board in flexion. Lighting power supply 250 is fastened on a lower face of mounting board 270 at one end part in the longitudinal direction of mounting board 270, and terminal block 260 is fastened on the lower face at the other end part. Mounting board 270 is connected to top board 280 fastened to the upper part of base unit 210 of the device body.

Including light-emitting device 100 according to the first embodiment, illumination device 200 emits light with increased color uniformity and is capable of being manufactured with increased productivity.

The above-described downlight is an example of illumination device 200 including light-emitting device 100 according to the first embodiment for the third embodiment. Such an illumination device including light-emitting device 100 may be implemented as an illumination device of a different type, such as a spotlight or a ceiling light.

Furthermore, the light-emitting devices described for the first embodiment to the third embodiment may be included in illumination device 200 instead of light-emitting device 100.

Other Embodiments

The present invention is not limited to the above-described first to fifth embodiments on the basis of which the light-emitting device, the method of manufacturing the light-emitting device, the illumination light source, and the illumination device as disclosed above.

For example, the light-emitting device according to the above-described first embodiment produces white light using blue LED chips 20b and a yellow phosphor in combination. In the present invention, white light may be produced otherwise than this combination.

For example, phosphor containing resin containing a red phosphor and a green phosphor may be used in combination with blue LED chips 20b. Optionally, ultraviolet LED chips may be used in combination with blue phosphor particles, green phosphor particles, and red phosphor particles. The ultraviolet LED chips emit ultraviolet light, which is shorter in wavelength than light emitted by blue LED chips 20b. The blue phosphor particles, red phosphor particles, and green phosphor particles are excited mainly by ultraviolet light to emit blue light, green light, and red light.

The number of the light-emitting element arrays and the number of light-emitting elements included in each of the light-emitting element arrays are not limited in particular. For example, each of the light-emitting element arrays may include, as a third light-emitting element, an LED chip which emits light of a color different from the color of light emitted from the first light-emitting elements or the second light-emitting elements.

The LED chips and SMD LEDs are examples of light-emitting elements used in the light-emitting devices in the above-described embodiments. Instead, solid-state light-emitting elements of other types, including semiconductor light-emitting element such as semiconductor lasers, or electro luminescence (EL) devices such as organic EL devices and inorganic EL devices may be used.

Embodiments resulting from various modifications of the above-described embodiments as well as embodiments resulting from any combinations of constituent elements of the different embodiments that may be conceived by those skilled in the art are also intended to be included within the scope of the present invention as long as they do not depart from the essence of the present disclosure.

What is claimed is:

1. A light-emitting device comprising:
a board; and
a plurality of light-emitting element arrays connected in parallel and each including a plurality of light-emitting elements mounted on the board and connected in series, the light-emitting elements in each of the plurality of light-emitting element array including a plurality of first light-emitting elements which emit light of a color, and a plurality of second light-emitting elements which emit light of a color different from the color of the light emitted by the plurality of first light-emitting elements, wherein:
each light-emitting element of the plurality of first light-emitting elements on the board is disposed non-successively to any other light-emitting element of the plurality of first light-emitting elements in a first direction and in a second direction, the first direction being a direction along which the light-emitting elements included in one of the plurality of light-emitting element arrays including the plurality of first light-emitting elements are arranged, and the second direction being a direction perpendicular to the first direction, at least two second light-emitting elements of the plurality of second light-emitting elements are directly connected to each other in the first direction, each light-emitting element of the plurality of first light-emitting elements is sealed with a first sealant, each light-emitting element of the plurality of second light-emitting elements is sealed with a second sealant different from the first sealant, and the first sealant partly covers second sealant.

2. The light-emitting device according to claim 1, wherein the light-emitting elements included in the plurality of light-emitting element arrays are arranged in a matrix, the first direction is one of a direction along a row of the matrix and a direction along a column of the matrix, and the second direction is the other of the direction along the row of the matrix and the direction along the column of the matrix.

3. The light-emitting device according to claim 1, wherein the light-emitting elements included in the plurality of light-emitting element arrays are arranged in concentric circles, the first direction is one of a circumferential direction of the concentric circles, and the second direction is a radial direction of the concentric circles.

4. The light-emitting device according to claim 1, wherein the plurality of light-emitting element arrays each include a number n of the first light-emitting elements and a number m of the second light-emitting elements, and n:m=1:k, where 1≤k≤2.

5. The light-emitting device according to claim 1, wherein the light emitted by the plurality of first light-emitting elements is red light, and the light emitted by the plurality of second light-emitting elements is blue light.

6. The light-emitting device according to claim 5, wherein the plurality of first light-emitting elements are red light-emitting diodes (LEDs) having an emission spectrum with a peak wavelength ranging from 630 nanometers to 645 nanometers, inclusive, and the plurality of second light-emitting elements are blue LEDs having an emission spectrum with a peak wavelength ranging from 430 nanometers to 500 nanometers, inclusive.

7. The light-emitting device according to claim 1, wherein:

the first sealant is a light-transmissive resin material containing no phosphor, and the second sealant is a light-transmissive resin material containing a phosphor.

8. The light-emitting device according to claim 7, wherein the second sealant is the light-transmissive resin material for the first sealant to which a phosphor is added.

9. The light-emitting device according to claim 7, wherein the phosphor contained in the second sealant has an emission spectrum with a peak wavelength ranging from 545 nanometers to 570 nanometers, inclusive.

10. An illumination light source comprising the light-emitting device according to claim 1.

11. An illumination device comprising the light-emitting device according to claim 1.

12. The light-emitting device according to claim 1, wherein:

the light-emitting elements included in the plurality of light-emitting element arrays are radially arranged, the first direction is a radial direction, and the second direction is a circumferential direction.

* * * * *